Figure 3:
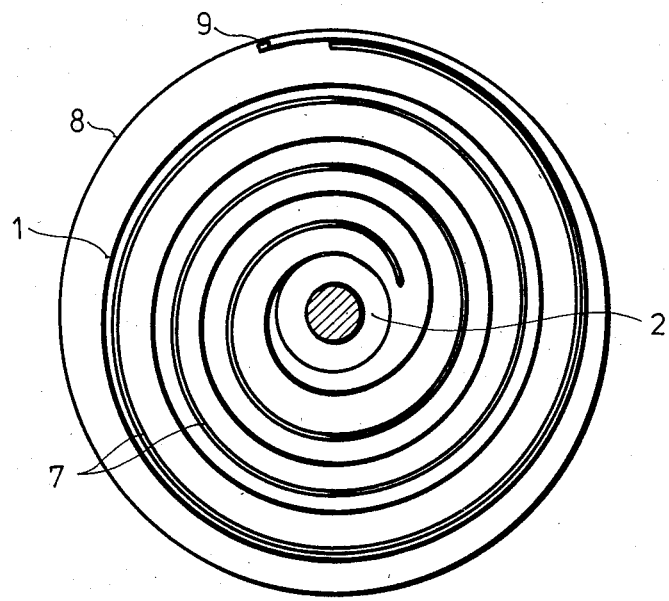

United States Patent [19]

Böhm et al.

[11] Patent Number: 4,595,184
[45] Date of Patent: Jun. 17, 1986

[54] CONTROLLABLE SPIRAL SPRING, IN PARTICULAR WITH LOGARITHMIC CHARACTERISTICS

[75] Inventors: Nándor Böhm; János Böhm; Róbert Böhm, all of Budapest, Hungary

[73] Assignee: Kozuti Kozlekedesi Tudomanyos Kutato Intezet, Budapest, Hungary

[21] Appl. No.: 175,707

[22] Filed: Aug. 6, 1980

[51] Int. Cl.⁴ .................................................. F16F 1/08
[52] U.S. Cl. ........................................ 267/156; 185/45
[58] Field of Search ............... 267/156, 155, 154, 157, 267/166–180, 151–153, 59, 58, 615, 62; 33/1 SP, 138; 185/45; 310/246, 247; 242/107.5, 107

[56] References Cited

U.S. PATENT DOCUMENTS

| | | | |
|---|---|---|---|
| 1,843,928 | 2/1932 | Owens | 185/45 X |
| 2,674,306 | 4/1954 | Prieto | 185/45 X |
| 2,941,415 | 6/1960 | Hawkins | 267/156 X |
| 3,550,928 | 12/1970 | Antritter | 267/156 |
| 3,819,169 | 6/1974 | Imme et al. | 267/156 |
| 3,955,809 | 5/1976 | Hara et al. | 267/156 |

FOREIGN PATENT DOCUMENTS

| | | |
|---|---|---|
| 310509 | 10/1973 | Austria . |
| 311194 | 11/1973 | Austria . |
| 457546 | 3/1928 | Fed. Rep. of Germany ...... 267/156 |
| 509562 | 10/1930 | Fed. Rep. of Germany ...... 267/156 |
| 1404047 | 8/1975 | United Kingdom ............... 267/157 |

*Primary Examiner*—Douglas C. Butler
*Attorney, Agent, or Firm*—Young & Thompson

[57] ABSTRACT

An instrument has a rotatable part and a helical spring secured to the instrument casing at its outer end and to the rotatable part at its inner end. The spring characteristics are made to depart from linear, by changing the cross-sectional area of the spring progressively substantially from one end to the other of the spring. Preferably, the spring thickness is kept constant and its width varied, as by providing a tapered slot through the spring along its length. Provision is made for further selectively varying the spring characteristics, by rendering inactive selected lengths of the outer turns of the spring. In one embodiment (FIGS. 1 and 2) this is done by providing a split ring that encircles the spring and whose ends can be moved toward or away from each other to contact selected lengths of the outer turns of the spring. In other embodiments (FIGS. 3 and 4) a helical rib coaxial and coextensive with the spring is rotated relative to the spring to contact varying lengths of the inner (FIG. 3) or outer (FIG. 4) side of the outermost turns of the spring.

3 Claims, 5 Drawing Figures

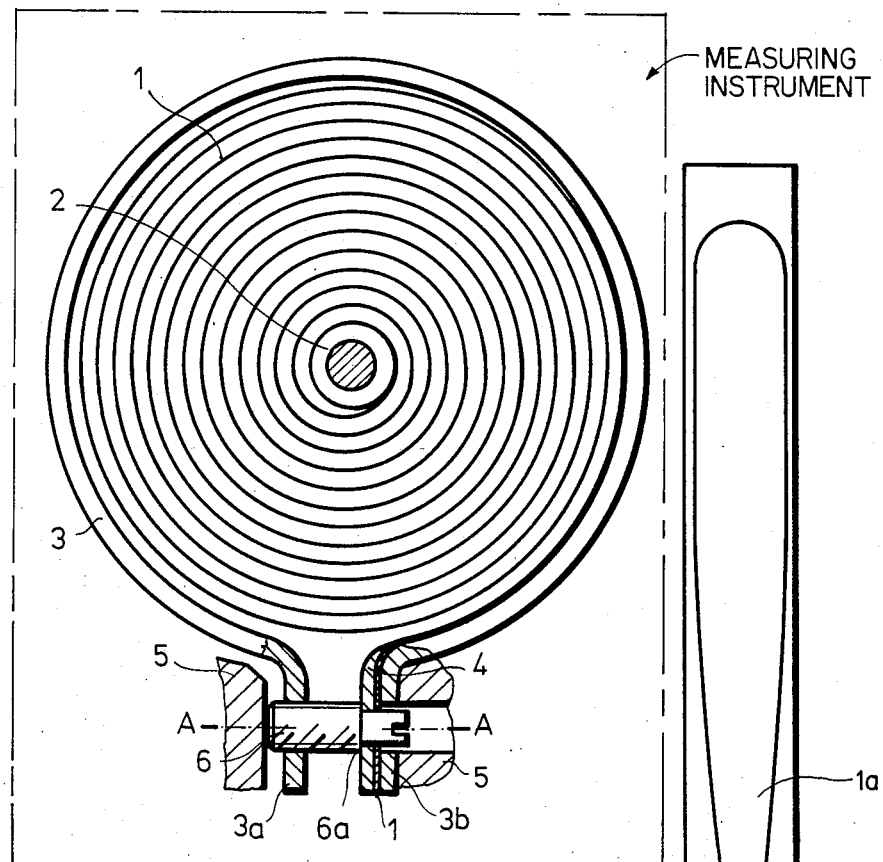
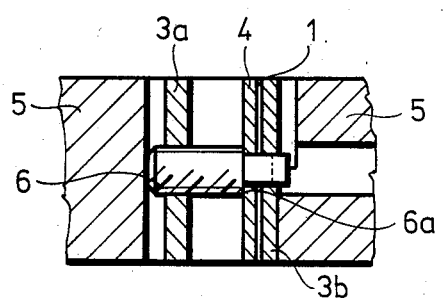
Fig. 1
Fig. 2
Fig. 2a

U.S. Patent   Jun. 17, 1986   Sheet 2 of 2   4,595,184

CONTROLLABLE SPIRAL SPRING, IN PARTICULAR WITH LOGARITHMIC CHARACTERISTICS

The invention relates to a controllable spiral spring, in particular with logarithmic characteristics, which is generally used in structures performing continuous measuring and observance of phenomena or the changes thereof, or in measuring systems, particularly tachometers, speedometers, dynamometers and other mechanical instruments.

Said instruments, measuring systems, particularly tachometers, speedometers, dynamometers etc. indicate, measure and if need be register in a given field of application the changes in phenomena to be continuously observed. The phenomena are mostly those indicating compliance with important requirements and they are controlled with good results in all instruments actuated with a spiral spring, e.g. speedometers, the primary task of which is to ensure the accident-free traffic of motor vehicles. In practice, by using the tested or measured phenomena and based thereon, the operation of equipment and machines may be influenced, and operational steps may be controlled and automated.

Said instruments indicate the observed phenomena by the moment exerted on the shaft; taking into consideration, that said moments are mostly linear, the phenomena are displayed on a linear scale by means of the well known instrumental spiral spring, while the characteristic curve of the spiral is linear with the deflection or the moment.

At the same time, it has been attempted to render linear those phenomena deviating from the linear, by using complicated devices, e.g. instruments measuring the quantity of flowing liquids. Moment sensors are also well known, which display the phenomena on empirical scales, e.g. on a linear scale in the case of certain distance recorders. It often happens, that due to the extreme length of the whole range the scale of the measurement range has to be restricted, as a consequence, neither satisfactory not accurate values can be obtained.

The object of the invention is to eliminate the drawbacks enumerated and by the simultaneous maintenance of the otherwise well-operating sensors, instruments and measuring systems to display the measured values on an optimally chosen scale i.e. scale division, e.g. to display the linear moment produced by the sensor on a logarithmic scale or to display the squared moment on a logarithmic or linear scale.

In accordance with the invention this object is achieved by using a new-type, changeable spiral spring exerting a retaining force contrary to the rotation of the pointers, and delivering a counterpressure.

The spiral spring according to the invention may be applied in a combined arrangement, in a given case of two-stage or a multistage embodiment may be serviceable too.

A further and very important object of the invention is the display based on the results of the sensors delivering the different moments.

In general, the resuls of the instruments are mutually compared, i.e. more complex values are formed as needed. Up-to-now this process could be performed by calculations using a sliderule or a computer, based on an instantaneous value. The sensing instruments with the logaritmic scale may be concentrically arranged—similarly to a circular slide-rule, a logarithmic disc—which operate quite independently from each other by means of a pointer, which will always show the required value in the same manner, as does the cursor of the slide-rule.

EXAMPLE A

In a motor vehicle the speedometer indicates the instantaneous speed of the vehicle (Km/hour), while a consumption indicator shows the instantaneous gasoline consumption (liters/h). When both values are indicated on concentrically arranged logarithmic scales, the pointer will indicate the momentary specific consumption in liters/100 km, yielding a reference value for the most economical driving. Up-to-now, this theoretical value could be obtained by individually read values only after having performed the individual calculations, or by using a slide-rule, but it could never be obtained while driving.

EXAMPLE B

The output has been calculated on the basis of the moment and number of revolutions of Otto or Diesel engines, measured on a block testing stand. When both sensors are provided with a logarithmic scale, the instrument indicates the output.

EXAMPLE C

The most simple instruments used in electrotechnique measure the voltage in V and current intensity in A, performing this measurement with separate sensors. In the case of a combined performance, instantaneous consumption (W) or instantaneous resistance values (Ohm) are displayed; simultaneously the instrument displays the basic values of the sensor.

EXAMPLE D

The solution according to the invention may be excellently used in several fields of practice, in processing, in meteorology, automatization etc. As a practical field of application stores should be mentioned, where by connecting the adjustable unit prices and the weighed weights by means of a rotary disc, the sum total facilitates shopping and control.

The advantage of the invention lies in that the newly developed spiral spring is of small size and mass, being essentially a lightweight component or mechanical element, by the application of which all the constructed and existing measuring systems and sensors can be well used, as only the spiral spring therein has to be replaced. The spiral spring according to the invention is a spring would up in a known manner in a single plane in the form of an Archimedean spiral, the novelty and the essence of which lies in that it is wound up with its inner or outer beginning turns in such a manner, that it bears against the inner or outer surface of a cylindrical mantle, furthermore either alternatively, or in a combined manner, starting from its outer and/or inner turn, it is formed with a decreasing or increasing cross-section in the length of the bearing surface of the band, while the decrease or the increase of the cross-section can be realized by dimensioning in such a manner, that by simultaneously maintaining the thickness, the width of the band is continuously increased or decreased, respectively. With such a design of the spiral spring the work of the spring, i.e. the elastic return, the so-called countermoment in respect to the measuring instrument, i.e. display of the diagram, the so-called spring characteristics may be established.

Austrian patent Nos. 310,509 and 311,194 describe solutions, in which it has been tried to modify the behaviour of the spring under load by changing the dimensions. The springs described in one of said patents are heavy-duty springs, mostly used in the automobile industry; one of them is a conical coil spring, in which the coils subjected to less load are formed with smaller diameters, accordingly, savings in the spring material can be achieved and when applying the full load, the turns of the spring are uniplanarly arranged. The spring described in the other of said patents is a cylindrical spring in the form of a rod, while the ends thereof are machined to a smaller size for taking up the initial torsional load. The object of this is to save material and space, having been directed neither to springs used in measuring systems, nor to spiral springs and the modified spring characteristics thereof.

Figure 4:
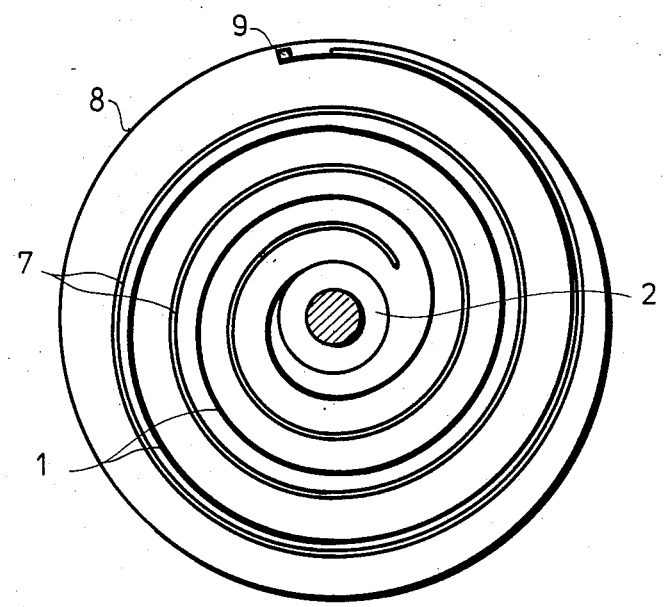

The invention will be described in detail by means of preferred embodiments, by the aid of the accompanying drawings, wherein:

FIG. 1 is a top plan view of the spiral spring with the partial section of the carrier ring, FIG. 2 is a vertical section through A—A of FIG. 1, FIG. 2a shows the spread out lengths of one spring-band with the cut-out reducing the cross-section, FIGS. 3 and 4 show diverse variations for the arrangement of the spiral spring.

The inner end of the spiral spring 1 is connected to the pointer-axle of the instrument to be retained or to be backwound, i.e. to the tightly fitted ring 2, the so-called barrel- arbour, while the turn of the outer end bears against the inner wall of the annular casing 3 or the carrier ring and against the turns in continuation thereof.

In dependence on the number of the seated turns, the oblong cross-section of the spring-band continuously decreases and increases, respectively. Decrease and increase of the cross-section are preferably realized by changing the width of the band, sumultaneously keeping the thickness of the spring-band, since this solution represents an easier task, than changing the thickness during the rolling process.

Decrease or increase of the cross-section of the spring-band by changing the width thereof may be realized in accordance with FIG. 2a, in this case there is a cutout 1a in the spring strip 1. The cutout—serving for the decrease of the cross-section—may be formed by pressing. Knowing the driving moment and the angle of rotation, the change of the cross-section and the bandwidth can be determined by calculation based on the spring characteristics.

The carrier ring 3 encasing the spiral ring and forming the case thereof, is a split ring and as a continuation of the ends the shanks 3a and 3b are formed; to one of them (3b) the outer and of the spring-band is fixed by means of the insert-tip 4 arranged as a lining. The spiral spring may be arranged together with the annular casing 3 in the spring cover 5 or in any other expediently shaped space of the instrument. The diameter of the annular casing 3 can be modified by means of the screw 6. The end of the screw 6 bears against the wall of the spring-cover 5 and its spindle remains in a threaded connection with the shank 3a of the annular casing; at the end of the threads it against the insert tip 4 and presses the same together with the shank 3b against the annular casing.

The screw is suitable for fixing the spiral spring and the carrier ring in the spring cover 5; by turning the screw by means of a screwdriver by changing the distances of the shanks 3a and 3b of the casing 3 and by increasing or decreasing the diameter of the casing enclosing the spiral ring, the number of the outer turns bearing against casing 3 and accordingly the prestress of the spring are changed; the whole process can be carried out in the mounted state of the spring, in the place of its use.

The spiral spring 1, the annular casing 3 and the adjusting screw 6 can be changed as a unit and can be arranged in the spring cover 5 i.e. in any suitable space of the instrument.

The spiral spring according to the invention, operating in accordance with the non-linear, preferably logarithmic characteristics, may be produced as in FIGS. 3 and 4, where within the casing incorporating the spring, the insert 8, provided with the helical rib 7 is arranged. By rotating insert 8, the length of the outer end of spring 1 that is in contact with rib 7 is altered, thereby altering the spring characteristics.

In the version shown in FIG. 4 by rotating the ribbed insert, the outer turns of the spring 1 are seated to a greater or lesser extent on the inner surface of the rib 7. By seating the turns of the spiral spring by rotating the ribs, the working length of the spring and as a consequence, the characteristics of the spring may be well controlled by means of the angle of rotation of insert 8.

The function of the spring according to the logarithmic characteristics may be modified by changing the lead of the helix, while the change can be easily realized by rotation of the ribbed insert 8.

Instead of the usual metals, the spring strip may be made of a synthetic material of proper elasticity, preferably of a fiber-reinforced strip, e.g. a glass-fiber-reinforced strip.

In the versions described here, the springs are formed expediently with an unchanged thickness in the whole length of the band, while the changing cross-section is obtained by the continuous increase or decrease of the width.

The embodiments shown in FIGS. 3 and 4 are simpler embodiments, simultaneously maintaining the essence of the invention, in so far as the spring strip 1 is made of a synthetic material, while the insert 8 and the rib 7 are shaped a monolithic unit in course of molding. The spring—wound in the insert 8—may be arranged in the spring casing, while the outer spring end 9 is led through the aperture of the spring casing and clamped therein. The adjustment of the insert 8 with the spiral ribs can be easily performed from outside by means of the screw spindle, with the simultaneous modification of the characteristics of the spring.

In the previously described embodiment the spiral spring may be manipulated together with the insert 8 and forms an interchangeable unit to be placed in the spring casing. The number of the turns of the spring guiding rib 7 formed helically on the insert 8 and the length thereof may be selected in complicance with the length and number of turns of the spring to be applied used.

The spring may be produced from materials, which do not even require the change of the cross-section of the band, since the logarithmic formation of the characteristics may be achieved by a different modification of the lead of the turn to be realized by the aid of the rib 7. The basic material may be metal, non-metal, glass or a synthetic material or any other material having the proper modulus of elasticity.

What we claim:

1. In a measuring instrument having a casing and a rotatable indicator shaft, and a helical spring secured at its outer end to the casing and at its inner end to the shaft; the improvement in which the cross sectional area of the spring varies progressively substantially from end to end thereof, the thickness of the spring measured radially of the shaft being substantially constant and the total width of the spring varying substantially from end to end thereof, the spring having an elongated cutout therethrough extending lengthwise of the spring, the width of the cutout varying progressively substantially from end to end thereof.

2. Apparatus as claimed in claim 1, and means selectively to contact various lengths of the outermost turns of the spring.

3. Apparatus as claimed in claim 2, said means comprising a split ring encompassing the spring, and means to move the ends of the split ring toward and away from each other thereby to bring selectively more and less, respectively, of the outer periphery of the spring into contact with the inner periphery of the split ring.

* * * * *